United States Patent [19]
Lin et al.

[11] Patent Number: 5,959,892
[45] Date of Patent: Sep. 28, 1999

[54] APPARATUS AND METHOD FOR PROGRAMMING VIRTUAL GROUND EPROM ARRAY CELL WITHOUT DISTURBING ADJACENT CELLS

[75] Inventors: Chin-Hsi Lin, Hsinchu; Shi-Charng Ai; Chien-Sing Lee, both of Taipei; Ful-Long Ni, Hsinchu; Mam-Tsung Wang, Hsinchu; Chin-Yi Huang, Hsinchu, all of Taiwan

[73] Assignee: Macronix International Co., Ltd., Hsinchu, Taiwan

[21] Appl. No.: 08/918,796

[22] Filed: Aug. 26, 1997

[51] Int. Cl.$^6$ ................................. G11C 16/04
[52] U.S. Cl. .................. 365/185.28; 365/185.23; 365/185.16; 365/230.04
[58] Field of Search .......... 365/185.28, 185.23, 365/185.16, 185.14, 185.02, 185.18, 230.04

[56] References Cited

U.S. PATENT DOCUMENTS

| | | | |
|---|---|---|---|
| 3,916,169 | 10/1975 | Cochran et al. | 235/156 |
| 3,934,233 | 1/1976 | Fisher et al. | 340/173 R |
| 4,021,781 | 5/1977 | Caudel | 340/172.5 |
| 4,281,397 | 7/1981 | Neal et al. | 365/189 |
| 4,387,447 | 6/1983 | Klass et al. | 365/203 |
| 4,460,981 | 7/1984 | Van Buskirk et al. | 365/189 |
| 4,628,487 | 12/1986 | Smayling | 365/185 |
| 4,635,347 | 1/1987 | Lien et al. | 29/591 |
| 4,698,900 | 10/1987 | Esquivel | 437/52 |
| 4,720,323 | 1/1988 | Sato | 437/69 |
| 4,795,719 | 1/1989 | Eitan | 437/43 |
| 4,806,201 | 2/1989 | Mitchell et al. | 156/653 |
| 4,833,514 | 5/1989 | Esquivel et al. | 357/23.5 |
| 4,849,943 | 7/1989 | Pfennings | 365/230.03 |
| 4,903,105 | 2/1990 | Najji | 357/38 |
| 4,935,791 | 6/1990 | Namaki et al. | 357/23.5 |
| 4,939,696 | 7/1990 | Sasaki et al. | 365/230.03 |
| 4,958,326 | 9/1990 | Sakurai | 365/218 |
| 4,961,164 | 10/1990 | Miyaoka et al. | 365/177 |
| 4,967,399 | 10/1990 | Kuwabara et al. | 365/230.06 |
| 4,977,538 | 12/1990 | Anami et al. | 365/230.03 |
| 4,992,980 | 2/1991 | Park et al. | 365/104 |
| 5,008,865 | 4/1991 | Shaffer et al. | 368/10 |
| 5,020,026 | 5/1991 | Schreck et al. | 365/104 |
| 5,023,837 | 6/1991 | Schreck et al. | 365/185 |
| 5,027,321 | 6/1991 | Park | 365/185 |
| 5,126,808 | 6/1992 | Montalvo et al. | 357/23.5 |
| 5,128,895 | 7/1992 | Park | 365/185 |
| 5,204,835 | 4/1993 | Eitan | 365/185 |
| 5,245,570 | 9/1993 | Fazio et al. | 365/185 |
| 5,317,535 | 5/1994 | Talreja et al. | 365/185 |
| 5,337,274 | 8/1994 | Ohji | 365/185 |
| 5,359,555 | 10/1994 | Salter, III | 365/185 |
| 5,383,162 | 1/1995 | Shirai et al. | 365/231 |
| 5,493,139 | 2/1996 | Akiyama et al. | 257/316 |
| 5,544,099 | 8/1996 | Hara | 365/185.19 |

*Primary Examiner*—David Nelms
*Assistant Examiner*—Tuan T. Nguyen
*Attorney, Agent, or Firm*—Mark A. Haynes

[57] ABSTRACT

The present invention provides a method and an apparatus for programming a selected call within a virtual ground EPROM array cell without disturbing adjacent array cells. The electrical disturbance of data stored in adjacent cells is limited in a number of ways: (1) a column connection circuit is provided for selectively coupling together adjacent pairs of even-odd or odd-even column lines so that source and drain terminals of adjacent memory cells are electrically coupled together, thereby preventing the data stored within the adjacent cells from being disturbed; (2) a current limiter circuit is provided for lowering a potential on a terminal of the selected cell at a controlled rate during programming so that voltages on terminals of the selected cell do not disturb data stored on adjacent memory cells; (3) the order in which programming signals are applied to terminals of the selected cell are controlled in such a way as to reduce the disturbance of data on adjacent cells; and (4) high wordline and data line voltages are applied to the selected cell in two steps, first to an intermediate voltage, and then to a high voltage. This reduces the disturbance to adjacent cells and improves programming.

25 Claims, 7 Drawing Sheets

APPARATUS AND METHOD FOR PROGRAMMING VIRTUAL GROUND EPROM ARRAY CELL WITHOUT DISTURBING ADJACENT CELLS

BACKGROUND

1. Field of the Invention

The present invention relates to semiconductor memory devices, and more particularly to a method and an apparatus for programming a virtual ground EPROM array cell without disturbing adjacent cells.

2. Related Art

The continuing demand for higher speed and lower cost semiconductor memories has led to the development of the virtual ground memory design for reprogrammable nonvolatile memories. A virtual ground memory design can increase array density while maintaining process compatibility with existing semiconductor processes. Representative examples of the virtual ground memory arrays are disclosed in U.S. Pat. Nos. 3,916,169, 3,934,233, 4,021,781 and 4,387,447.

While virtual ground memory designs enjoy advantages from increased bit density, they have a number of disadvantages. One disadvantage is the problem of unwanted interaction between adjacent memory cells. This interference can take the form of a program disturb condition, in which programming of a selected cell leads to unwanted programming of unselected adjacent memory cells. This interference can also take the form of a read access degradation due to an unwanted current component. In both situations, the interference affects memory cells located in adjacent columns and connected to the selected row line. Interaction between adjacent cells also causes parasitic currents which interfere with reading, erasing and programming of individual cells. Ultimately, the access speed and integrity of the memory array is adversely affected by these problems.

What is needed is a programming mechanism for virtual ground EPROM memory arrays that allows for programming of a selected memory cell without disturbing data stored on adjacent unselected memory cells.

SUMMARY

The present invention provides a method and an apparatus for programming a selected cell within a virtual ground EPROM array without disturbing adjacent array cells. The electrical disturbance of data stored in adjacent cells is limited in a number of ways: (1) a column connection circuit is provided for selectively coupling together adjacent pairs of even-odd or odd-even column lines so that source and drain terminals of adjacent memory cells are electrically coupled together, thereby preventing the data stored within the adjacent cells from being disturbed; (2) a current limiter circuit is provided for lowering a potential on a terminal of the selected cell at a controlled rate during programming so that voltages on terminals of the selected cell do not disturb data stored on adjacent memory cells; (3) the order in which programming signals are applied to terminals of the selected cell are controlled in such a way as to reduce the disturbance of data on adjacent cells; and (4) high wordline and data line voltages are applied to the selected cell in two steps, first to an intermediate voltage, and then to a high voltage. This reduces the disturbance to adjacent cells and improves programming.

Thus, the present invention can be characterized as a method of programming a selected memory cell which avoids disturbance of data stored on adjacent cells, the selected memory cell being part of an electrically programmable semiconductor memory device, including an array of floating gate memory cells arranged in rows and columns so as to form an array. The memory cells include, a control gate, a first terminal and second terminal, the control gates of memory cells in a row being coupled to the same row line. The method comprises: applying a first potential to a row line coupled to the selected memory cell; coupling a first terminal of the selected memory cell to a first node; coupling a second terminal of the selected memory cell to a second node; applying a second potential to the first node; and lowering the potential on the second node at a controlled rate to a third potential to cause the transfer of electrons into a floating gate of the selected memory cell, the rate being controlled such that potentials on the first and second terminals of the selected cell do not disturb data stored on adjacent cells.

According to one aspect of the present invention, the method includes coupling together a first terminal and a second terminal of a memory cell adjacent to the selected memory cell so as to avoid disturbing data on the adjacent memory cell during programming of the selected cell.

According to another aspect of the present invention, the array of floating gate memory cells is divided into a plurality of blocks of floating gate memory cells, wherein blocks are independently selectable, and including the step of selecting a selected block containing the selected memory cell.

According to another aspect of the present invention, the method includes coupling together first and second terminals of memory cells not affected by programming of the selected cells to a fourth potential.

According to another aspect to the present invention, the lowering of the potential on the second node at a controlled rate takes place after the applying of the first potential to the wordline of the selected cell, and after the applying of the second potential of the first node, so that the second node is charged up by the first node through a conducting path between the first and second terminals of the selected cell, so that a programming current is reduced in such a way that data stored on adjacent cells is not disturbed by a high drain voltage.

According to another aspect of the present invention, the lowering of the potential on the second node takes place before the applying of the first potential to the row line of the selected cell, so that source side disturbance of data stored in adjacent cells is avoided.

According to another aspect of the present invention, the applying of the first potential to the row line of the selected cell takes place at a controlled rate in order to increase programming effectiveness while reducing disturbance of data stored in adjacent cells.

According to another aspect of the present invention, the applying of the first potential to the row line of the selected cell takes place in two phases in order to increase programming effectiveness while reducing disturbance of data stored in adjacent cells. These two phases include raising a voltage on the wordline of the selected cell to an intermediate potential lower than the first potential; waiting a fixed interval of time; and raising the voltage on the wordline of the selected cell to the first potential.

According to another aspect of the present invention, the applying of the second potential to the first node takes place at a controlled rate in order to reduce stress resulting from excessive voltage on the first terminal of the selected cell prior to the applying of the first potential to the row line.

According to another aspect of the present invention, the applying of the second potential to the first node takes place in two phases in order to reduce stress resulting from excessive voltage on the first terminal of the selected cell prior to the applying of the first potential to the row line. The two phases include: raising the voltage on the first node coupled to the first terminal of the selected cell to an intermediate potential lower than the second potential; waiting a fixed interval of time; and raising the voltage on the first node coupled to the second terminal of the selected cell to the second potential.

The present invention can also be characterized as an electrically reprogrammable memory device, comprising a plurality of floating gate memory cells arranged in rows and columns so as to form an array. Each memory cell includes a control gate and first and second terminals. The array includes: a plurality of row lines, the controls gates of cells in the same row being coupled to a common row line; a plurality of column lines coupled to the first and second terminals of memory cells in the array; a row decoder, coupled to the plurality of row lines, for selecting a row line coupled to a selected memory cell; a column decoder, for coupling a first column line coupled to the first terminal of the selected memory cell to a first potential, and for coupling a second column line coupled to the second terminal of the selected cell to a second potential, to cause programming of the selected memory cell; and a column connection circuit, coupled to column lines for coupling together pairs of column lines coupled to the first and second terminals of memory cells adjacent to the selected memory cell so as to avoid disturbing data stored on the adjacent memory cells by limiting voltage differences between the first and second terminals of the adjacent memory cells.

According to an aspect of the present invention, the electrically programmable memory device includes a current limiter circuit coupled to the plurality of column lines for controlling the rate at which a voltage drops on a column line coupled to the selected cell so as not to disturb data stored on adjacent cells during programming of the selected cell.

According to another aspect of the present invention, the array of floating gate memory cells is divided into a plurality of independently selectable blocks of floating gate memory cells.

According to another aspect of the present invention, the electrically programmable memory device includes a mechanism for coupling together first and second terminals of memory cells not affected by programming of the selected cell to a third potential.

DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
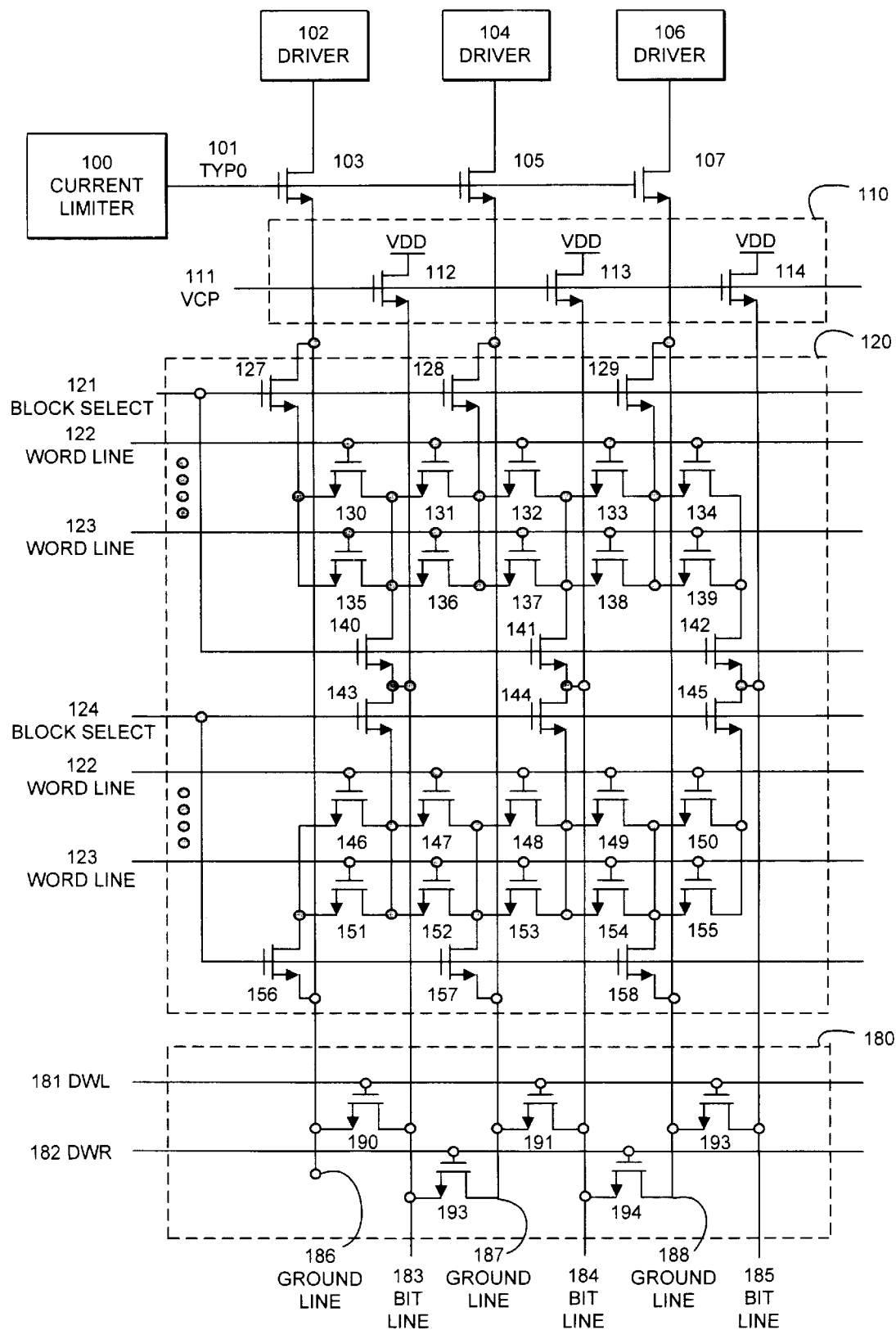
FIG. 1 is a circuit diagram illustrating the structure of an array of floating gate memory cells including programming circuitry in accordance with an aspect of the present invention.

FIG. 1 is a circuit diagram illustrating the internal structure of an array of floating gate memory cell in accordance with an aspect of the present invention. The array includes a plurality of floating gate memory cells, 130, 131, 132, 133, 134, 135, 136, 137, 138, 139, 146, 147, 148, 149, 150, 151, 152, 153, 154, and 155. The floating gate memory cells are coupled source to drain to form rows of floating gate memory cells. Control gates of all floating gate memory cells in a row are coupled to the same wordline. Floating gate memory cells 130, 131, 132, 133, and 134 are coupled together source-to-drain into a row, and the control gates of these floating gate memory cells are coupled to wordline 122. Floating gate memory cells 135, 136, 137, 138 and 139, are coupled together source-to-drain into a row, and the control gates of these floating gate transistors are coupled to wordline 123. Floating gate memory cells 146, 147, 148, 149 and 150 are coupled together source-to-drain into a row, and the control inputs of these floating gate memory cells are coupled to wordline 125. Floating gate memory cells 151, 152, 153, and 155, are coupled together source-to-drain into a row, and the control gates of these floating gates memory cells are coupled to wordline 126.

A number of column lines pass through the array of floating gate memory cells. These column lines are, in order from left to right, ground line 186, bit line 183, ground line 187, bit line 184, ground line 188 and bit line 185. These column lines can be selectively coupled to floating gate memory cells through a plurality of transistors controlled by blocks select signals 121 and 124. Block select signal 121 controls transistors 127, 128, 129, 140, 141 and 142, which couple ground lines 186, 187 and 188, and bit lines 183, 184 and 185, respectively, into a block of memory cells, including memory cells 130, 131, 132, 133, 134, 135, 136, 137, 138 and 139. Block select signal 124 controls transistors 143, 144, 145, 156, 157 and 158, which selectively couple ground lines 186, 187 and 188, and bit lines 183, 184 and 185, respectively, to floating gate memory cells 146, 147, 148, 149, 150, 151, 152, 153, 154 and 155. Only one of block select signals 121 and 124 is active at any one time. Hence, only one block of floating gate memory cells is coupled to the column lines at any given time.

The bit lines and ground lines connect to circuitry at the top of the array. Bit lines 183, 184 and 185 are coupled through transistors 112, 113 and 114 to a high voltage VDD. Transistors 112, 113 and 114 are coupled to and controlled by signal VCP 111. Signal VCP 111 is set to an intermediate voltage such as ⅓ VDD. Transistors 112, 113 and 114 effectively tie bit lines that are not involved in programming to an intermediate voltage ⅓ VDD. Ground lines 186, 187 and 188 are coupled through transistors 103, 105 and 107, at the top of FIG. 1, into drivers 102, 104 and 106, respectively. Drivers 102, 104 and 106 provide a ground voltage onto ground lines 186, 187 and 188, respectively, during programming of floating gate memory cells within the array. The rate at which voltage on ground lines 186, 187 and 188 drops to ground is controlled by current limiter 100, which produces signal TYP0 101, which controls transistors 103, 105 and 107. Current limiter 100 controls transistors 103, 105 and 107 in such a way as to limit the rate at which ground lines 186, 187 and 188 drop in voltage, thereby reducing problems of disturbing data on adjacent floating gate memory cells during programming of a selected floating gate memory cell.

The bit lines and ground lines connect to circuitry at the bottom of the array. Ground lines 186, 187 and 188 as well as bit lines 183, 184 and 185 are coupled together by transistors 190, 191, 192, 193 and 194. These transistors couple together odd-even and even-odd pairs of adjacent column lines selectively. Signal DWR 181 connects to the control inputs of transistors 190, 191 and 192. Signal DWL 182 connects to the control inputs of transistors 193 and 194. Transistor 190 selectively couples ground line 186 to bit line 183. Transistor 191 selectively couples ground line 187 to bit line 184. Transistor 192 selectively couples ground line 188 to bit line 185. Transistor 193 selectively couples bit line 183 to ground line 187. Transistor 194 selectively couples bit line 184 to ground line 188. Signal DWR 181 selectively couples ground lines to the next adjacent bit lines to the right of the ground lines. Signal DWL 182 selectively couples bit lines to the next adjacent ground lines to the right of the bit lines. Only one of signals DWL 181 and DWR 182 are active during programming. Hence, only even-odd or odd-even pairs of bit lines are coupled together during programming.

The above-described circuitry, controlled by signals DWR 181 and DWL 182, is used to couple together the source and drain of transistors adjacent to a transistor selected for programming. For example, if a floating gate transistor with a ground line on the left-hand side and a bit line on the right-hand side is to be programmed, signal DWL 182 is asserted to prevent disturbance of data stored on adjacent cells. On the other hand, if a floating gate memory cell with a bit line on the left-hand side and a ground line on the right-hand side is to be programmed, signal DWR 181 is asserted to prevent data on adjacent cells from being disturbed.

Figure 2:
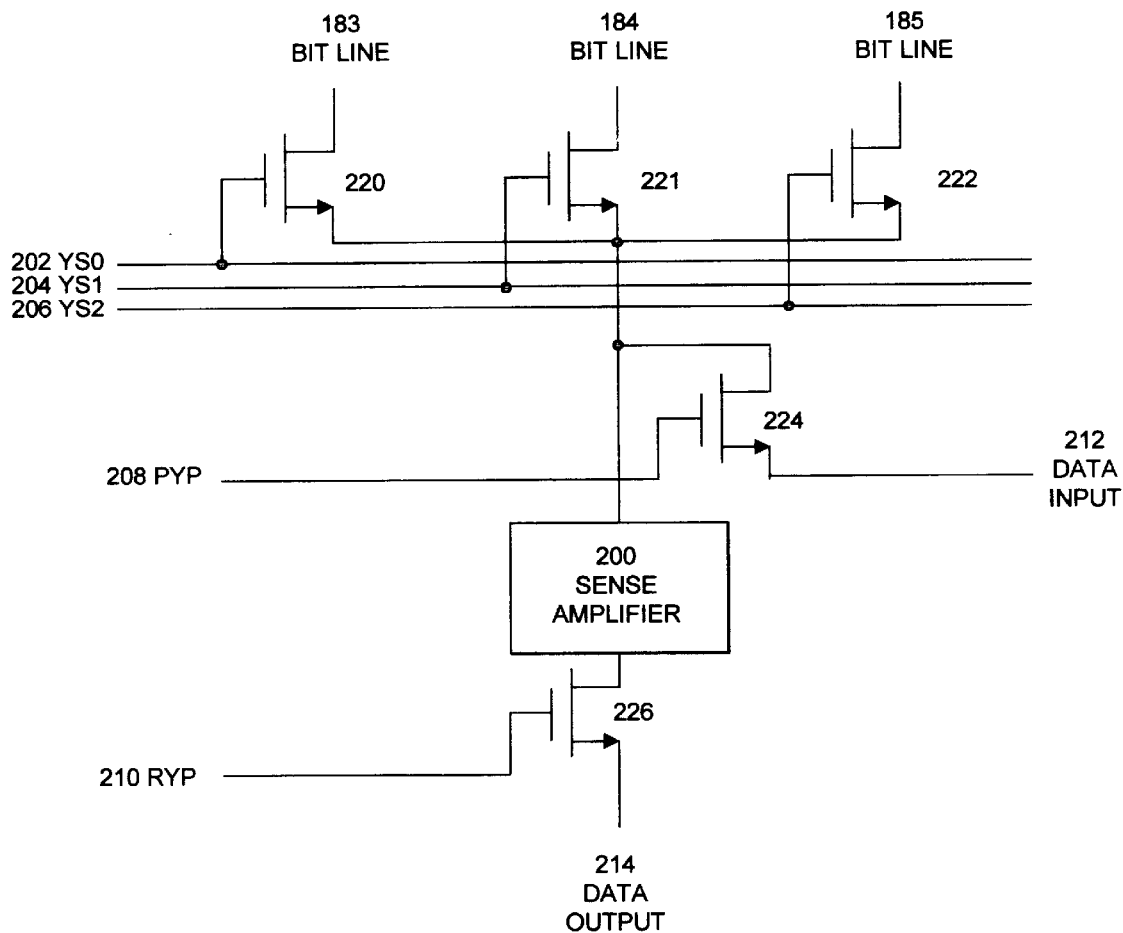
FIG. 2 is a circuit diagram illustrating circuitry for connecting data input 212 and data output 214 into bit lines 183, 184 and 185 from FIG. 1 in accordance with an aspect of the present invention.

FIG. 2 illustrates circuitry for moving data into and out of bit lines 183, 184 and 185 emanating from the bottom of the array of floating gate memory cells in FIG. 1 in accordance with an aspect of the present invention. Bit lines 183, 184 and 185 from the bottom of FIG. 1 lead into the top of FIG. 2. Bit line 183 feeds through transistor 220 into the drain of transistor 224 and sense amplifier 200. Transistor 220 is controlled by signal YS0 202. Bit line 184 passes through transistor 221 into the drain of transistor 224 as well as the input of sense amplifier 200. Transistor 221 is controlled by signal YS1 204. Bit line 185 feeds through transistor 222 into the drain of transistor 224 as well as into the input of sense amplifier 200. Transistor 222 is controlled by signal YS2 206.

Signals YS0 202, YS1 204 and YS2 206 emanate from a decoder circuit which selects one of bit lines 183, 184 and 185. Bit lines 183, 184 and 185 feed through transistor 224 to data input 212. Transistor 224 is controlled by signal PYP 208. These bit lines also feed into sense amplifier 200, which feeds through transistor 226 to data output 214. Transistor 226 is controlled by signal RYP 210.

The circuit illustrated in FIG. 2 acts a gateway for data flowing into and out of bit lines of the array pictured in FIG. 1. When signal PYP 208 is asserted, data input 212 feeds through transistor 224 into one of bit lines 183, 184 and 185, depending upon which of select lines YS0 202, YS1 204, and YS2 206 are active. In this way data feeds through data input 212 and into one of bit lines 183, 184 and 185.

Alternatively, data can feed from bit lines 183, 184 and 185 into sense amplifier 200, which senses the signal from bit lines 183, 184 and 185, and outputs either a zero value or a one value. This value is outputted through transistor 226 onto data output 214 under control of signal RYP 210.

Figure 3:
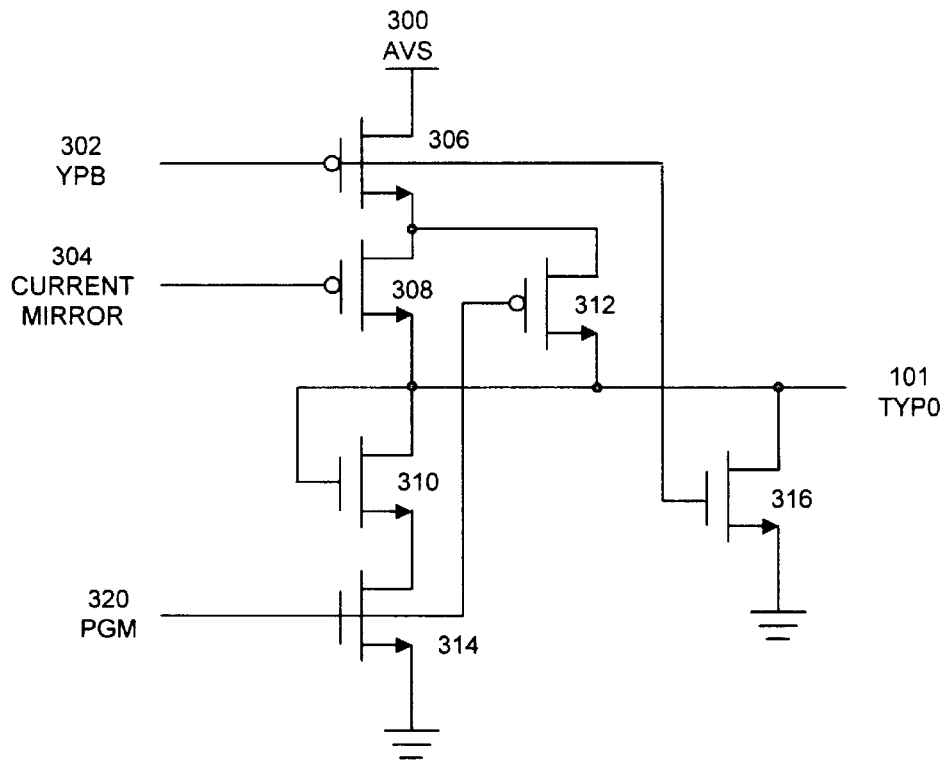
FIG. 3 is a circuit diagram illustrating the internal structure of current limiter circuit 100 from FIG. 1 in accordance with an aspect of the present invention.

FIG. 3 illustrates a circuit for controlling the rate at which voltage drops during programming on a ground line of the array of floating gate memory cells in FIG. 1 during programming of a selected floating gate memory cell in accordance with an aspect of the present invention. The circuit illustrated in FIG. 3 includes six transistors, including p-channel transistors 306, 308 and 312, and n-channel transistors 310, 314 and 316. The source of p-channel transistor 306 connects to AVS 300, and the drain connects to the source of p-channel transistor 308, and the source of p-channel transistor 312. The gate of p-channel transistor 306 connects to signal YPB 302. Signal YPB 302 additionally connects to the gate of n-channel transistor 316. The drain of p-channel transistor 308 connects to the gate and drain of n-channel transistor 310, the drain of p-channel transistor 312, the drain of n-channel transistor 316 and output signal TYP0 101. The gate of p-channel transistor 308 connects to current mirror signal 304, which emanates from a current mirror. The source of n-channel transistor 310 connects to the drain of n-channel transistor 314. The gate of n-channel transistor 314 connects to the input signal PGM 320, and the source of n-channel transistor 314 connects to ground. The source of n-channel transistor 316 also connects to ground. The signals YPB 302, current mirror 304 and PGM 320 are operative to control the circuit in FIG. 3 to produce signal TYP0 101, which controls the driving of ground lines 186, 187 and 188 from a high voltage to a low programming voltage at a controlled rate. In order to reduce the impact of process variations across the memory array, portions of the array are used as a current source. In this way, the rate at which signals on ground lines 186, 187 and 188 go from a high voltage to a low voltage are controlled so that data is not disturbed on adjacent cells during programming of a selected cell.

Figure 4:
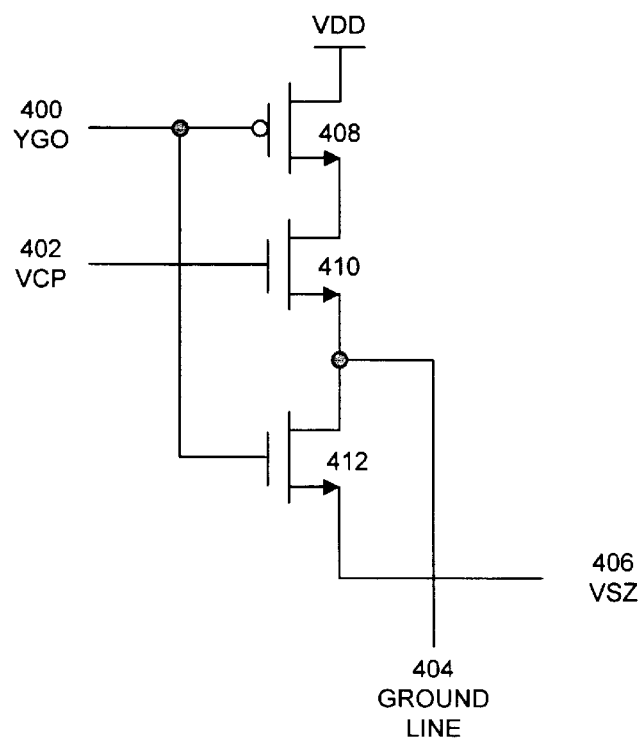
FIG. 4 is a circuit diagram illustrating the internal structure of a driver, such as drivers 102, 104 and 106 in FIG. 1, in accordance with an aspect of the present invention.

FIG. 4 is a circuit diagram of the structure of driver circuit, such as is found in drivers 102, 104 and 106 in FIG.

1 in accordance with an aspect of the present invention. The circuit takes two input signals YG0 400 and VCP 402. Signal YG0 400 connects to a gate of p-channel transistor 408 and the gate of n-channel transistor 412. The signal VCP 402 connects to the gate of n-channel transistor 410. The source of p-channel transistor 408 connects to VDD and the drain of p-channel transistor 408 connects to the drain of n-channel transistor 410. The source of n-channel transistor 410 connects to the drain of n-channel transistor 412 as well as ground line 404. The source of n-channel transistor 412 connects to signal VSZ 406. Signal VCP 402 is maintained at an intermediate voltage, such as ⅓ VDD. This tends to raise the voltage on ground line 404 to VCP-VT when ground line 404 is not coupled to other voltage levels. When signal YG0 400 is asserted to a high value, a conducting path is created between ground line 404 and VSZ 406 through transistor 412. This pulls ground line 404 to a ground voltage.

Figure 5:
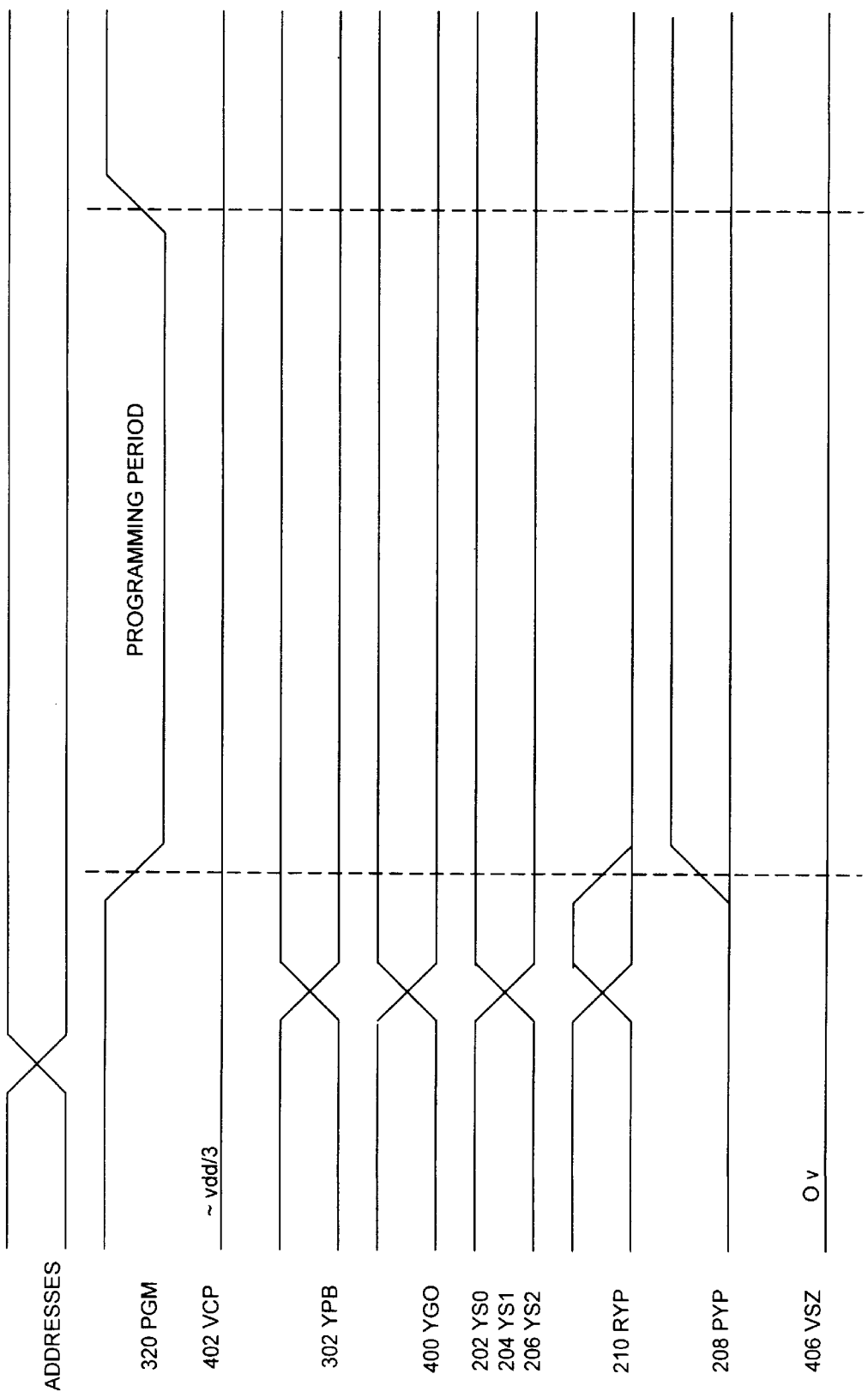
FIG. 5 is a timing diagram illustrating the sequence in which signals are applied to the array of floating gate memory cells from FIG. 1 during programming of a selected memory cell in accordance with an aspect of the present invention.

FIG. 5 is a timing diagram illustrating the sequence of control signals in the array illustrated in FIG. 1 during programming of a selected cell in accordance with an aspect of the present invention. The lines VCP 402 and VSZ 406 assume fixed values, with VSZ 406 tied to a ground voltage, and VCP 402 tied to a voltage of approximately ⅓ VDD. The control signals are activated in the following sequence.

First, the address lines feeding into the array are asserted to specify the address of a selected cell.

Next, signal lines YPB 302, YG0 400, YS0 202, YS1 204, YS2 206 and RYP 210 are activated. Signals YPB 302 and YG0 400 initiate the controlled voltage drop on one of the ground lines in FIG. 1. Signals YS0 202, YS1 204 and YS2 206 select one of bit lines 183, 184 and 185 through the circuitry illustrated in FIG. 2. If a read operation is desired, signal RYP 210 opens up data output 214 through transistor 226 in FIG. 2.

Next, the programming commences. Signal PGM 320 assumes a low voltage to initiate the process, and signal PYP 208 assumes a high voltage to pass data input 212 through transistor 224 into one of bit lines 183, 184 and 185 in FIG. 2. At this time, signal RYP 210 goes low to shut off the data output from the circuit. After programming is complete, signal PGM 320 rises back to a high voltage in order to terminate the programing process.

Referring to FIG. 1, assume that transistor 132 is the selected transistor to be programmed. Wordline 122 is asserted to a high value, which brings the gate of transistor 132 to a high value in preparation for programming. Block select signal 121 is asserted and couples ground line 187 to the source of transistor 132 and bit line 184 to the drain input of transistor 132. Data to be programmed into selected memory cell 132 feeds through data input 212 (shown in FIG. 2) into bit line 184, which is selected by signal YS1 204. This data feeds into the drain of transistor 132. Next, the voltage on ground line 187 is driven to ground by driver 104. This voltage decrease is controlled by current limiter 100 so as to reduce spurious programming of adjacent memory cells. Once the voltage on the drain of transistor 132 reaches ground, programming commences, and a short period of time later the input from data input 212 is programmed into floating gate transistor 132.

Figure 6:
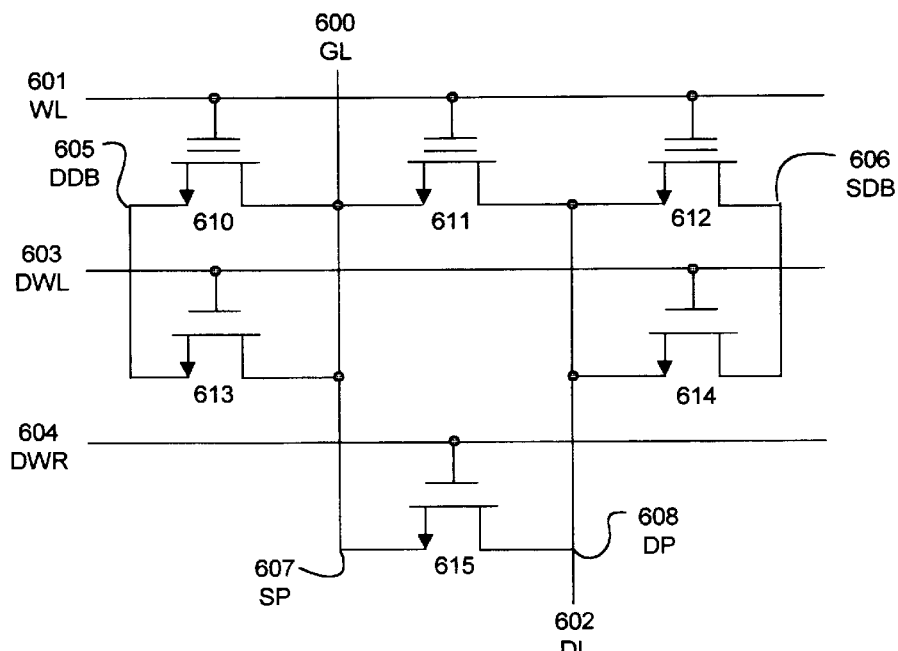
FIG. 6 is a circuit diagram illustrating how column lines of the array of floating gate memory cells are coupled together so as to reduce the disturbance of data stored on adjacent cells during programming of a selected cell in accordance with an aspect of the present invention.

FIG. 6 is a circuit diagram of a subset of the circuitry illustrated in FIG. 1 in accordance with an aspect of the present invention. FIG. 6 includes a selected transistor 611 along with adjacent transistors 610 and 612. All of these transistors have gates coupled to wordline 601. The drain of transistor 612 connects to node SDB 606, which connects to the drain of transistor 614. Both the source of transistor 612 and the source of transistor 614 connect to node DP 608, which also connects to the drain of transistor 611. Note that DP 608 additionally connects to signal input DL 602 and the drain of transistor 615. The source of transistor 611 connects to node SP 607, which also connects to the drain of transistor 610, the drain of transistor 613 and the source of transistor 615. SP 607 also connects to signal GL 600. The source of transistor 610 and the source of transistor 613 both connect to node DDB 605. The input DWL 603 connects to the gates of transistors 613 and 614. The input DWR 604 connects to the gate of transistor 615.

Figure 7:
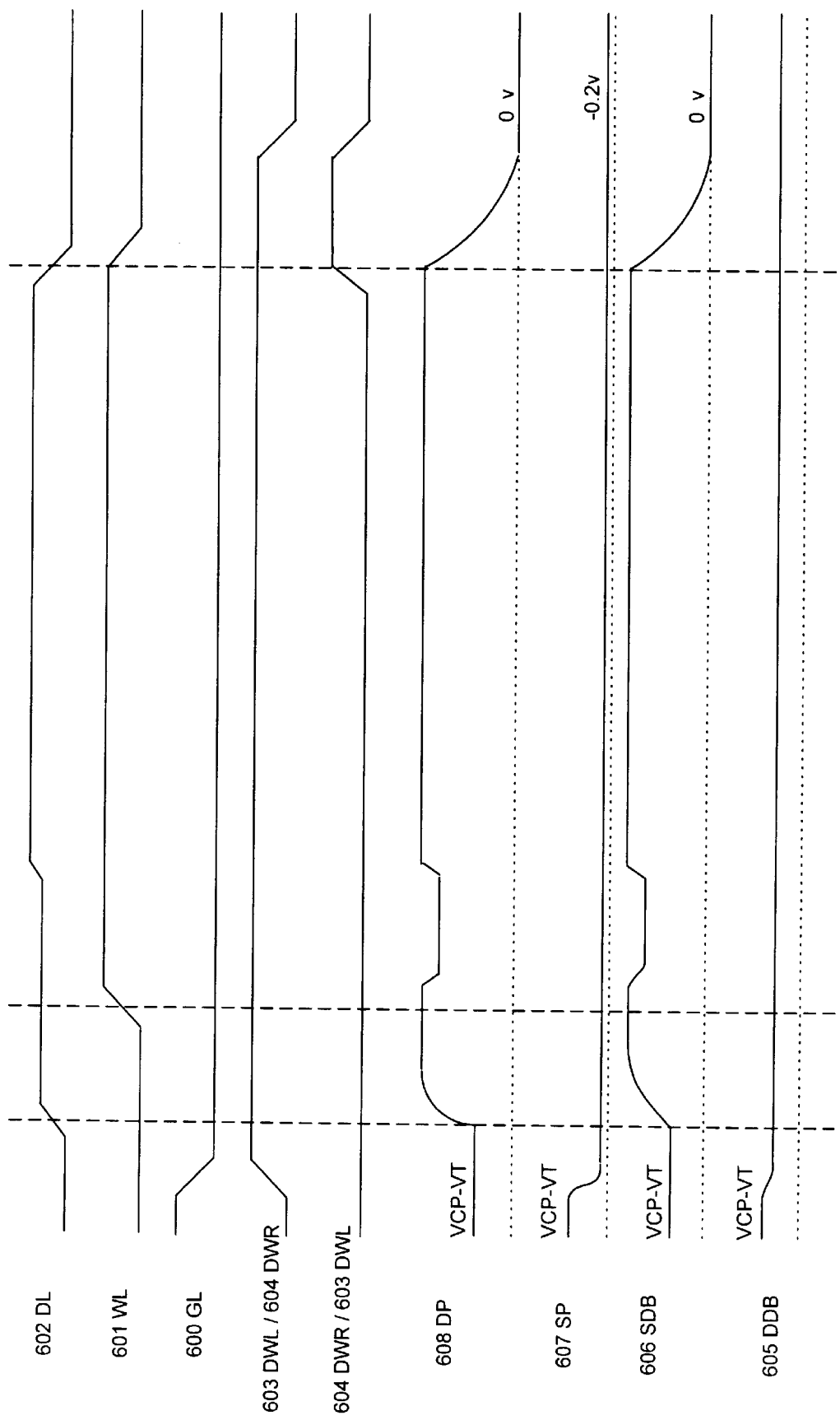
FIG. 7 is a timing diagram illustrating the voltage levels present on various nodes within FIG. 6 during a first programming mode in accordance with an aspect of the present invention.

FIG. 7 is a timing diagram illustrating voltage levels on various nodes within FIG. 6 during a first programming mode in accordance with an aspect of the present invention. This first programming mode provides a fast programming time and is subject to less source-side disturbance, and operates as follows. First, signal GL 600 drops to a low voltage forcing the source of transistor 611 to a low voltage. Also, signal DWL 603 rises to a high voltage, which creates a conducting path between node DDB 605 and node SP 607 through transistor 613, and creates a conducting path between node SDB 606 and node DP 608 through transistor 614. Next, signal DL 602 assumes a high voltage forcing the drain side of transistor 611 to a high voltage. Next, signal WL assumes a high voltage initiating programming of transistor 611. During this programming, signal DL 602 reaches an even higher voltage. Signal DL 602 is raised to a high voltage in two steps in order to reduce stress from an excessive voltage on signal line DL 602 prior to application of a high voltage to WL 601. The resulting voltages on nodes DP 608, SP 607, SDB 606 and DDB 605 also appear below in FIG. 7.

Figure 8:
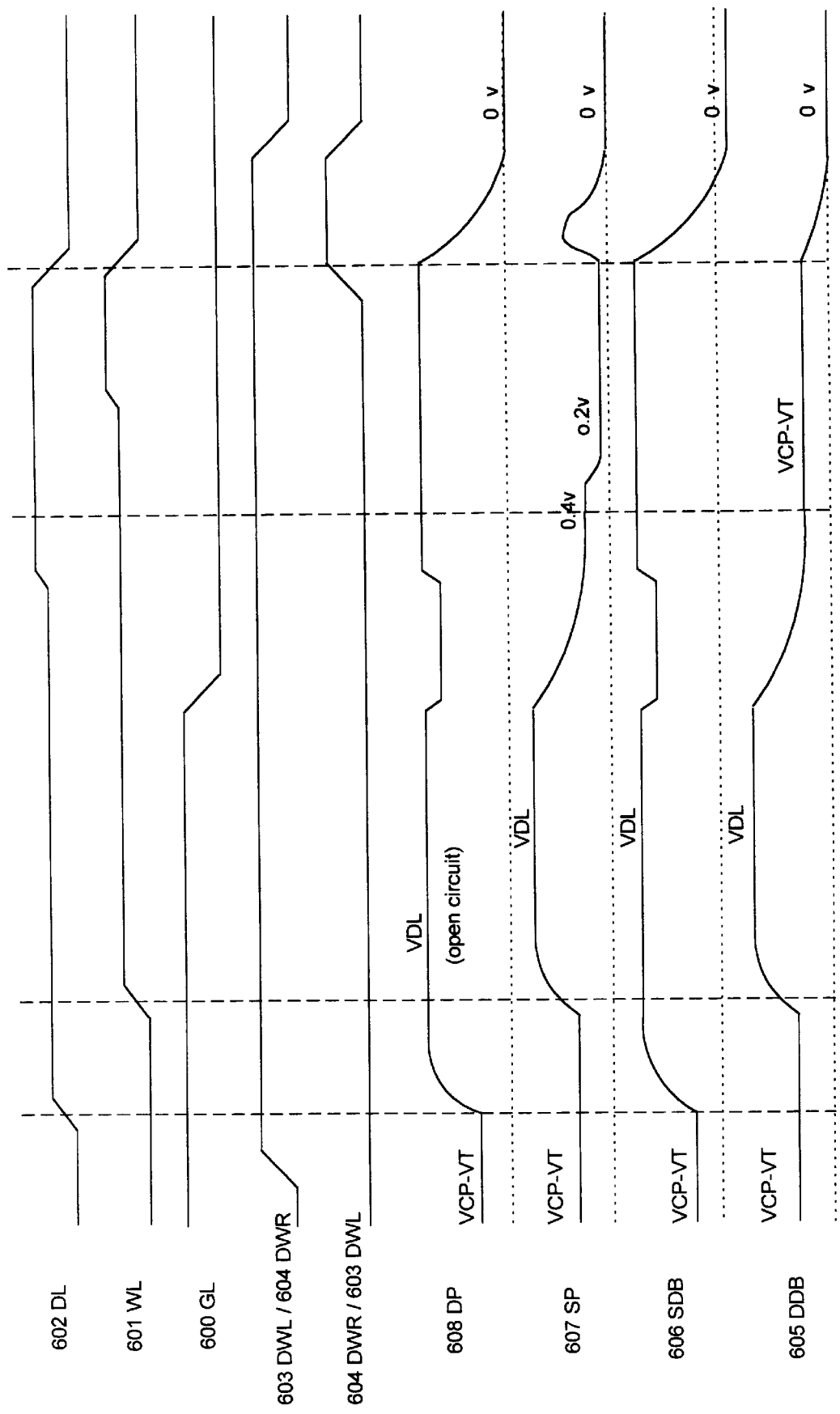
FIG. 8 is a timing diagram of the voltage levels on various nodes within FIG. 6 during a second programming mode in accordance with an aspect of the present invention.

FIG. 8 is a timing diagram illustrating voltages on various nodes of the circuit in FIG. 6 during a second programming mode, which requires less programming current, and hence reduces the drain-turn-on problem for adjacent cells in accordance with an aspect of the present invention. The signals in FIG. 8 are identical to the signals in FIG. 7 except for the fact that the signal GL 600 falls to a low voltage after both signals DL 602 and WL 601 assume a high voltage. This pulls down the source voltage on transistor 611 after the source voltage on transistor 611 is charged up by the voltage on DL 602 through transistor 611 as a consequence of WL 601 turning on transistor 601. Additionally, signal WL 601 is raised in two steps in order to increase programming effectiveness while reducing disturbance of data stored in adjacent memory cells.

Figure 9:
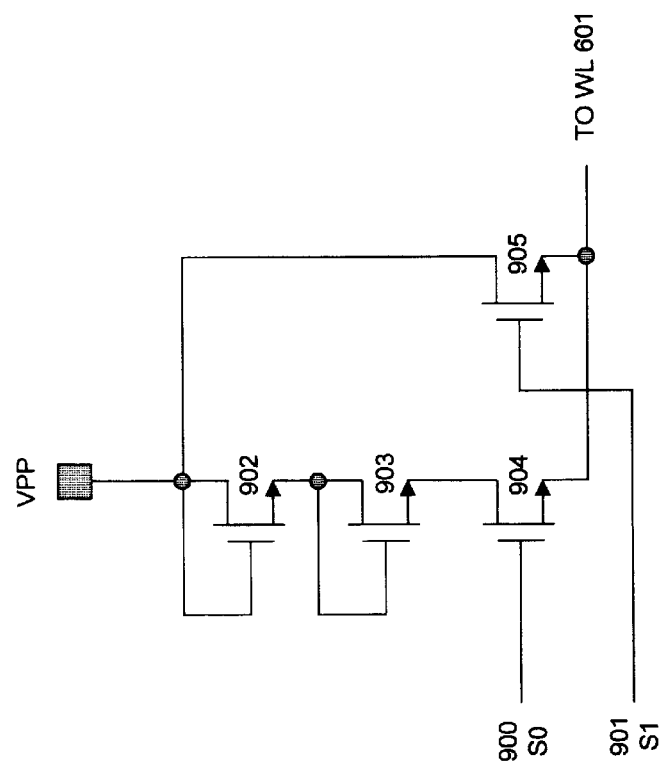
FIG. 9 is a circuit diagram illustrating the structure of a wordline driver for providing a two-step wordline voltage in accordance with an aspect of the present invention.

FIG. 9 is a circuit diagram illustrating circuitry used to produce a two-step voltage for a wordline, as is used to generate signal WL 601 in FIG. 8 in accordance with an aspect of the present invention. This circuit has two inputs, S0 900 and S1 901. Signal S1 901 feeds into the gate of transistor 905. The drain of transistor 905 connects to VPP and the source of transistor 905 connects to signal WL 601. When signal S1 901 is asserted, a conducting path is created between VPP and WL 601 through transistor 905. Signal S0 900 feeds into the gate of transistor 904, and the source of transistor 904 connects to signal WL 601. The drain of transistor 904 is coupled to VPP through diode-connected transistors 902 and 903. In this way, when signal S0 900 is asserted, a conducting path is established between signal WL 601 and VPP-2T. In order to generate a two-step voltage, signal S0 900 is asserted first. This causes WL 601 to assume a voltage of VPP-3T. Next, signal S1 901 is asserted. This causes WL 601 to assume a voltage of VPP-VT, which is the final high voltage.

Figure 10:
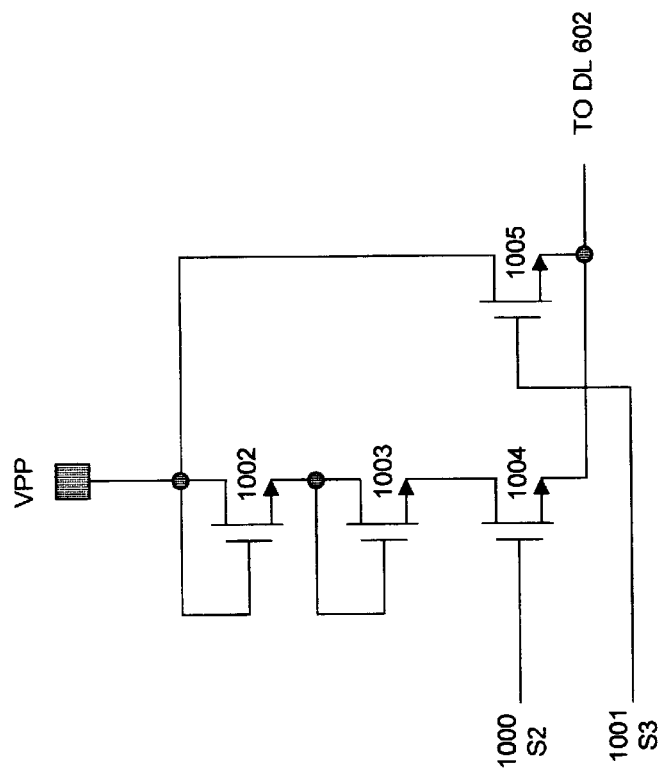
FIG. 10 is a circuit diagram illustrating the structure of a data line driver for driving a two-step voltage onto a data line in accordance with an aspect of the present invention.

FIG. 10 illustrates the same circuitry to generate a two-step voltage rise as is illustrated in FIG. 9, except that the circuitry is connected to signal line DL 602 instead of WL 601. The circuitry operates in exactly the same manner as the circuitry illustrated in FIG. 9.

The present invention prevents disturbance of data stored on adjacent cells during programming of a selected cell in the following way. Referring to FIG. 1, assume memory cell 132 is a selected cell to be programmed. Since a high wordline voltage is necessary for programming, the only other cells that can potentially be programmed must be coupled to the same wordline, wordline 122. Also, the cells must be located in the same block in order for the column lines to be connected to the source and drain inputs of the cells. This means that only transistors which are within the block activated by block select signal 121 and are coupled to wordline 122 can be affected. Furthermore, a high drain voltage is required for programming. This means memory cells 131, 133 and 134 are the only potential candidates for spurious programming. Recall, from the prior discussion that two programming modes are associated with the disclosed embodiment.

Consider the first programming mode. In order to program transistor 132, signal DWR 182 is asserted so that source and drain of transistor 131 will be coupled together through transistor 193, and source and drain of transistor 133 will be coupled together through transistor 194. Transistor 131 will not be programmed because the voltage on ground line 187 is low during programming of transistor 132, and the voltage on bit line 183 is lower than VCP-VT as a result of transistor 193 being turned on. Hence, the voltage across transistor 131 is too low for programming to take place.

Transistor 133 will not be programmed. Before wordline 122 rises to a high voltage, ground line 188 is pulled to a high voltage as a result of transistor 194 being turned on. Furthermore, bit line 184 is coupled to a high voltage. Consequently, transistor 133 will not be programmed.

Transistor 134 will not be programmed either. Before wordline 122 goes to a high voltage, the voltage on ground line 188 is coupled to a high voltage and voltage on bit line 185 is coupled to VCP-VT. Consequently, the voltage across transistor 134 is VDL-(VCP-VT). Hence, transistor 134 will not be programmed.

The second programming mode is slightly different than the first programming mode. In the second programming mode, the above discussion for transistors 133 and 134 is the same as for the first programming mode. However, the discussion for memory cell 131 is different. Before ground line 187 is pulled down to a low voltage, the voltage on ground line 187 and bit line 183 are held to a high voltage as a result of transistor 132 being turned on. The voltage across transistor 131 is limited by the controlled rate at which ground line 187 falls to a low value. Hence, transistor 131 will not be programmed. Recall, that this controlled voltage drop is accomplished by driver 104 feeding through transistor 105 which is controlled by current limiter 100 in FIG. 1.

The foregoing description of embodiments of the invention have been presented for purposes of illustration and description only. They are not intended to be exhaustive or to limit the invention to the forms disclosed. Obviously, many modifications and variations will be apparent to practitioners skilled in the art.

What is claimed is:

1. A method of programming a selected memory cell which avoids disturbance of data stored on adjacent cells, the selected memory cell being part of an electrically programmable semiconductor memory device including a plurality of floating gate memory cells arranged in rows and columns so as to form an array, memory cells in the plurality of memory cells including a control gate, a first terminal and a second terminal, the control gates of memory cells in a row being coupled to a same row line, the method comprising:

applying a first potential to a row line coupled to the selected memory cell;

coupling a first terminal of the selected memory cell to a first node;

coupling a second terminal of the selected memory cell to a second node;

applying a second potential to the first node; and lowering a potential on the second node at a controlled rate to a third potential to cause the transfer of electrons into a floating gate of the selected memory cell, the rate being controlled such that potentials on the first and second terminals of the selected cell do not disturb data stored on adjacent cells.

2. The method of claim 1, including:

coupling together a first terminal and a second terminal of a memory cell adjacent to the selected memory cell so as to avoid disturbing data on the adjacent cell during programming of the selected cell.

3. The method of claim 1, including:

coupling together a first terminal and a second terminal of an adjacent memory cell on one side of the selected memory cell so as to avoid disturbing data on the adjacent cell on one side of the selected memory cell during programming of the selected cell; and coupling together a first terminal and a second terminal of an adjacent memory cell on another side of the selected memory cell so as to avoid disturbing data on the adjacent cell on another side of the selected memory cell during programming of the selected cell.

4. The method of claim 1, including coupling the first terminal to the second terminal of the selected cell after programming of the selected cell is complete.

5. The method of claim 1, wherein the array of floating gate memory cells is divided into a plurality of blocks of floating gate memory cells, blocks in the plurality of blocks being independently selectable, and including selecting a selected block containing the selected memory cell.

6. The method of claim 1, including coupling first and second terminals of memory cells not affected by programming of the selected cell to a fourth potential.

7. The method of claim 1, wherein the array of floating gate memory cells is divided into a plurality of blocks of floating gate memory cells, blocks in the plurality of blocks being independently selectable, and including:

selecting a selected block containing the selected memory cell, and coupling first and second terminals of memory cells in the selected block not affected by programming of the selected cell to a fifth potential.

8. The method of claim 1, wherein the lowering of the potential on the second node at a controlled rate takes place after the applying of the first potential to the row line of the selected cell, and after the applying of the of the second potential to the first node, so that the second node is charged up by the first node through a conducting path between the first and second terminals of the selected cell, so that a programming current is reduced in such a way that data stored on adjacent cells is not disturbed by a high drain voltage.

9. The method of claim 1, wherein the lowering of the potential on the second node takes place before the applying of the first potential to the row line of the selected cell, so that source side disturbance of data stored in adjacent cells is avoided.

10. The method of claim 1, wherein the applying of the first potential to the row line of the selected cell takes place at a controlled rate.

11. The method of claim 1, wherein the applying of the first potential to the row line of the selected cell takes place in two phases in order to increase programming effectiveness while reducing disturbance of data stored in adjacent cells, including:

raising a voltage on the row line of the selected cell to an intermediate potential lower than the first potential;

waiting a fixed interval of time; and raising the voltage on the row line of the selected cell to the first potential.

12. The method of claim 1, wherein the applying of the second potential to the first node takes place at a controlled rate.

13. The method of claim 1, wherein the applying of the second potential to the first node takes place in two phases in order to reduce stress resulting from an excessive voltage on the first terminal of the selected cell prior to the applying of the first potential to the row line, including:

raising a voltage on the first node coupled to the first terminal of the selected cell to an intermediate potential lower than the second potential;

waiting a fixed interval of time; and raising the voltage on the first node coupled to the first terminal of the selected cell to the second potential.

14. A method of programming a selected memory cell which avoids disturbance of data stored on adjacent cells, the selected memory cell being part of an electrically programmable semiconductor memory device including a plurality of floating gate memory cells arranged in rows and columns so as to form an array, memory cells in the plurality of memory cells including a control gate, a first terminal and a second terminal, the control gates of memory cells in a row being coupled to a same row line, the method comprising:

applying a first potential to a row line coupled to the selected memory cell;

coupling a first terminal of the selected memory cell to a first node;

coupling a second terminal of the selected memory cell to a second node;

applying a second potential to the first node; and lowering a potential on the second node to a third potential to cause the transfer of electrons into a floating gate of the selected memory cell, the lowering taking place after the applying of the first potential to the row line of the selected cell, and after the applying of the second potential to the first node, so that the second node is charged up by the first node through a conducting path between the first and second terminals of the selected cell, so that a programming current is reduced in such a way that floating gates of adjacent cells are not disturbed by a high drain voltage.

15. A method of programming a selected memory cell which avoids disturbance of data stored on adjacent cells, the selected memory cell being part of an electrically programmable semiconductor memory device including a plurality of floating gate memory cells arranged in rows and columns so as to form an array, memory cells in the plurality of memory cells including a control gate, a first terminal and a second terminal, the control gates of memory cells in a row being coupled to a same row line, the method comprising:

applying a first potential to a row line coupled to the selected memory cell;

coupling a first terminal of the selected memory cell to a first node;

coupling a second terminal of the selected memory cell to a second node;

applying a second potential to the first node; and lowering the potential on the second node to a third potential to cause the transfer of electrons into a floating gate of the selected memory cell, the lowering taking place before the applying of the first potential to the row line of the selected cell, so that source side disturbance of data stored in adjacent cells is avoided.

16. A method of programming a selected memory cell which avoids disturbance of data stored on adjacent cells, the selected memory cell being part of an electrically programmable semiconductor memory device including a plurality of floating gate memory cells arranged in rows and columns so as to form an array, memory cells in the plurality of memory cells including a control gate, a first terminal and a second terminal, the control gates of memory cells in a row being coupled to a same row line, the method comprising:

applying a first potential to a row line coupled to the selected memory cell;

coupling a first terminal of the selected memory cell to a first node;

coupling a second terminal of the selected memory cell to a second node;

applying a second potential to the first node in two phases in order to reduce stress resulting from an excessive voltage on the first terminal of the selected cell prior to the applying of the first potential to the row line, including, raising the voltage on the first node coupled to the first terminal of the selected cell to an intermediate potential lower than the second potential, waiting a fixed interval of time, and raising the voltage on the first node coupled to the first terminal of the selected cell to the second potential; and lowering the potential on the second node to a third potential to cause the transfer of electrons into a floating gate of the selected memory cell.

17. A method of programming a selected memory cell which avoids disturbance of data stored on adjacent cells, the selected memory cell being part of an electrically programmable semiconductor memory device including a plurality of floating gate memory cells arranged in rows and columns so as to form an array, memory cells in the plurality of memory cells including a control gate, a first terminal and a second terminal, the control gates of memory cells in a row being coupled to a same row line, the method comprising:

applying a first potential to a row line coupled to the selected memory cell, the applying taking place in two phases in order increase programming effectiveness while reducing disturbance of data stored in adjacent cells, including, raising a voltage on the row line of the selected cell to an intermediate potential lower than the first potential, waiting a fixed interval of time, and raising the voltage on the row line of the selected cell to the first potential;

coupling a first terminal of the selected memory cell to a first node;

coupling a second terminal of the selected memory cell to a second node;

applying a second potential to the first node; and lowering the potential on the second node to a third potential to cause the transfer of electrons into a floating gate of the selected memory cell.

18. An electrically programmable memory device, comprising:

a plurality of floating gate memory cells arranged in rows and columns so as to form an array, each memory cell including a control gate and first and second terminals;

a plurality of row lines, the control gates of cells in the same row being coupled to a common row line in the plurality of row lines;

a plurality of column lines coupled to first and second terminals of memory cells in the array;

a row decoder, coupled to the plurality of row lines, for selecting a row line coupled to a selected memory cell;

a column decoder, for coupling a first column line coupled to the first terminal of the selected memory cell to a first potential, and for coupling a second column line coupled to the second terminal of the selected memory cell to a second potential, to cause programming of the selected memory cell; and a column connection circuit, coupled to column lines in the plurality of column lines for coupling together pairs of column lines coupled to the first and second terminals of memory cells adjacent to the selected memory cell in one of a first mode and a second mode, so as to avoid disturbing data stored on the adjacent memory cells by limiting voltage differences between the first and second terminals of the adjacent memory cells, and in the first mode adjacent even-odd column lines coupled together and adjacent odd-even column lines not coupled together, and in the second mode adjacent odd-even column lines coupled together and adjacent even-odd column lines not coupled together.

19. The electrically programmable memory device of claim 18, including a current limiter circuit coupled to column lines in the plurality of column lines for controlling the rate at which voltage drops on a column line coupled to the selected cell so as not to disturb data stored on adjacent cells during programming of the selected cell.

20. The electrically programmable memory device of claim 18, wherein the array of floating gate memory cells is divided into a plurality of blocks of floating gate memory cells, blocks in the plurality of blocks being independently selectable.

21. The electrically programmable memory device of claim 18, including a mechanism for coupling together first and second terminals of memory cells not affected by programming of the selected cell to a third potential.

22. An electrically programmable memory device, comprising:

a plurality of floating gate memory cells arranged in rows and columns so as to form an array, each memory cell including a control gate and first and second terminals;

a plurality of row lines, the control gates of cells in the same row being coupled to a common row line in the plurality of row lines;

a plurality of column lines coupled to first and second terminals of memory cells in the array;

a row decoder, coupled to the plurality of row lines, for selecting a row line coupled to a selected memory cell;

a column decoder, for coupling a first column line coupled to the first terminal of the selected memory cell to a first potential and a second column line coupled to the second terminal of the selected memory cell to a second potential, to cause programming of the selected memory cell; and a current limiter circuit coupled to column lines in the plurality of column lines for controlling the rate at which voltage drops on a column line coupled to the selected cell so as not to disturb data stored on adjacent cells during programming of the selected cell.

23. The electrically programmable memory device of claim 22, including a column connection circuit coupled to column lines in the plurality of column lines for coupling together pairs of column lines coupled to the first and second terminals of memory cells adjacent to the selected memory cell so as to avoid disturbing data stored on the adjacent memory cells by limiting voltage differences between the first and second terminals of the adjacent memory cells.

24. The electrically programmable memory device of claim 22, wherein the array of floating gate memory cells is divided into a plurality of blocks of floating gate memory cells, blocks in the plurality of blocks being independently selectable.

25. The electrically programmable memory device of claim 22, including a column connection circuit coupled to column lines in the plurality of column lines for coupling together pairs of column lines coupled to the first and second terminals of memory cells adjacent to the selected memory cell so as to avoid disturbing data stored on the adjacent memory cells by limiting voltage differences between the first and second terminals of the adjacent memory cells, the column connection circuitry selectively coupling together adjacent pairs of even-odd and odd-even column lines.

* * * * *